(12) United States Patent
Yu et al.

(10) Patent No.: US 7,414,916 B1
(45) Date of Patent: Aug. 19, 2008

(54) USING DEDICATED READ OUTPUT PATH TO REDUCE UNREGISTERED READ ACCESS TIME FOR FPGA EMBEDDED MEMORY

(75) Inventors: Haiming Yu, San Jose, CA (US); Wei Yee Koay, Penang (MY)

(73) Assignee: Altera Corporation, San Jose, CA (US)

( * ) Notice: Subject to any disclaimer, the term of this patent is extended or adjusted under 35 U.S.C. 154(b) by 242 days.

(21) Appl. No.: 11/303,734

(22) Filed: Dec. 16, 2005

(51) Int. Cl.
*G11C 8/02* (2006.01)

(52) U.S. Cl. ............ 365/231; 365/230.02; 365/230.06; 365/230.08; 365/189.02; 365/189.08

(58) Field of Classification Search ............ 365/189.02, 365/230.02, 230.06, 230.08, 189.08
See application file for complete search history.

(56) References Cited

U.S. PATENT DOCUMENTS 5,715,205 A * 2/1998 Sywyk ..................... 365/219
6,356,110 B1 * 3/2002 Reddy et al. ................. 326/41
7,158,440 B2 * 1/2007 Duh et al. .................... 365/233

* cited by examiner

*Primary Examiner*—Hoai V. Ho
*Assistant Examiner*—Jason Lappas
(74) *Attorney, Agent, or Firm*—Townsend and Townsend and Crew LLP

(57) ABSTRACT

A memory unit includes width decoding logic enabling data to be accessed in a memory array at different data widths. To improve memory access speed, the memory unit also includes dedicated read output paths for accessing data at the full data width of the memory array. The dedicated read output paths bypass the width decoding logic and provide data from the memory array directly to a data bus, thereby providing improved memory performance when width decoding is not needed. The memory unit can be incorporated in programmable devices and a programmable device configuration can select either the read bypass paths or the width decoding logic. Hardware applications that require width decoding and improved memory access speed can utilize additional programmable device resources outside the memory unit to register the full width data from the memory unit and convert it to a different data width.

21 Claims, 4 Drawing Sheets

200

USING DEDICATED READ OUTPUT PATH TO REDUCE UNREGISTERED READ ACCESS TIME FOR FPGA EMBEDDED MEMORY

BACKGROUND OF THE INVENTION

The invention relates to the field of programmable devices and to memory units adapted to be used within programmable devices. Programmable devices, such as FPGAs, typically include thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and one or more memory units for storage and retrieval of data used by the logic cells. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The configuration of the logic cells, functional blocks, switching circuit, and other components of the programmable device is referred to as configuration data. Configuration data can be stored in volatile or non-volatile memory on the programmable device. Additionally, configuration data can be provided and temporarily or permanently loaded into the programmable device during its manufacturing. Users specify a user design that performs a desired information processing function. Compilation software tools analyze the user design and generate corresponding configuration data that implements the desired information processing function using a programmable device. The user-created configuration data can be temporarily or permanently loaded into one or more programmable devices to implement the user design. If the user design is changed, updated configuration data can be loaded into the programmable device to implement the changed user design.

Because programmable devices are designed to implement user designs having different requirements, many of the functional blocks of programmable devices can be configured to support the needs of different types of user designs. For example, the memory units of a programmable device can be configured to support different data widths and depths. The configurable data width and depth configurations allow a memory block having a given size to be addressed and accessed in many different ways. For example, a 4 kilobit memory unit in a programmable device may be configured to operate with a 1 bit output and 4096 possible addresses; a 2 bit output and 2048 possible addresses; a 4 bit output and 1024 possible addresses; a 8 bit output and 512 possible addresses; a 16 bit output and 256 possible addresses; or a 32 bit output and 128 possible addresses.

To provide configurable memory access width and depth, memory units in programmable devices typically include width encoding and decoding logic for writing and reading data to and from memory units. For example, width decoding logic can be placed between read sense amplifiers and the output of the memory unit to redirect data to the appropriate data output line based upon the data width specified for the memory unit. In this implementation, the memory read access time (Tco) includes not only delay contributions from normal reading mechanisms, such as address decoding, bit-lines precharge or discharge, and sense amplifier operation, but also a time delay from the width decoding logic. Often, the width decoding logic introduces a substantial time delay due to its large fan-out and capacitive loading. For user designs requiring high speed memory access, the extra time delay introduced by the width decoding logic can be unacceptable. Moreover, many high frequency user designs do not require memory units with configurable data widths, instead preferring to access memory units using their full data widths.

It is therefore desirable for a programmable device to include memory units that provide improved access times for full data width access despite the presence of width decoding logic. It is further desirable for the programmable device to enable more complicated width decoding schemes that do not compromise access times. It is also desirable for memory units to provide improved access times for full data width access without requiring substantial additional complexity.

BRIEF SUMMARY OF THE INVENTION

In an embodiment of an invention, a memory unit includes width decoding logic enabling data to be accessed in a memory array using a variety of different data widths. To improve memory access speed, an embodiment of the invention includes a set of dedicated read output paths for accessing data at the full data width of the memory array. The set of dedicated read output paths bypass the width decoding logic and provide data from the memory array directly to a data bus. The read bypass paths provide improved memory performance when width decoding is not needed. Embodiments of the memory unit can be incorporated in programmable devices. The use of the set of read bypass paths or the width decoding logic can be specified with a programmable device configuration. In a further embodiment, hardware applications that require width decoding and improved memory access speed can utilize additional programmable device resources outside the memory unit to register the full width data from the memory unit and convert it to a different data width.

In an embodiment, a memory unit includes a memory cell array adapted to store data and to output the data at a first data width. A memory width decoder unit is adapted to receive the data at the first data width from the memory cell array and to output at least a portion of the data at a second data width. An output unit is adapted to receive the portion of the data at the second width from the memory width decoder and to provide the portion of the data at the second data width to a data bus. A set of read bypass paths are connected between the memory cell array and the output unit and are adapted to provide the data at the first data width to the data bus. The data provided by the set of read bypass paths does not pass through at least a portion of the memory width decoder.

In another embodiment, the memory cell array is adapted to store data in at least one row including a plurality of columns. The first data width corresponds with the number of columns. The memory width decoder is adapted to receive at least a portion of a memory address. The memory width decoder includes a multiplexer adapted to receive data from a set of at least two columns of the memory cell array and to selectively connect one of the set of at least two columns of the memory cell array with one of a set of output connections of the output unit in response to the portion of the memory address. In an additional embodiment, the data provided by the set of read bypass paths does not pass through the multiplexer. In a further embodiment, the memory width decoder is further adapted to receive a memory configuration signal specifying the second data width and the multiplexer is further responsive to the memory configuration signal in selectively connecting one of the set of at least two columns of the memory cell array with one of the set of output connections of the output unit.

BRIEF DESCRIPTION OF THE DRAWINGS

The invention will be described with reference to the drawings, in which.

DETAILED DESCRIPTION OF THE INVENTION

Figure 1:
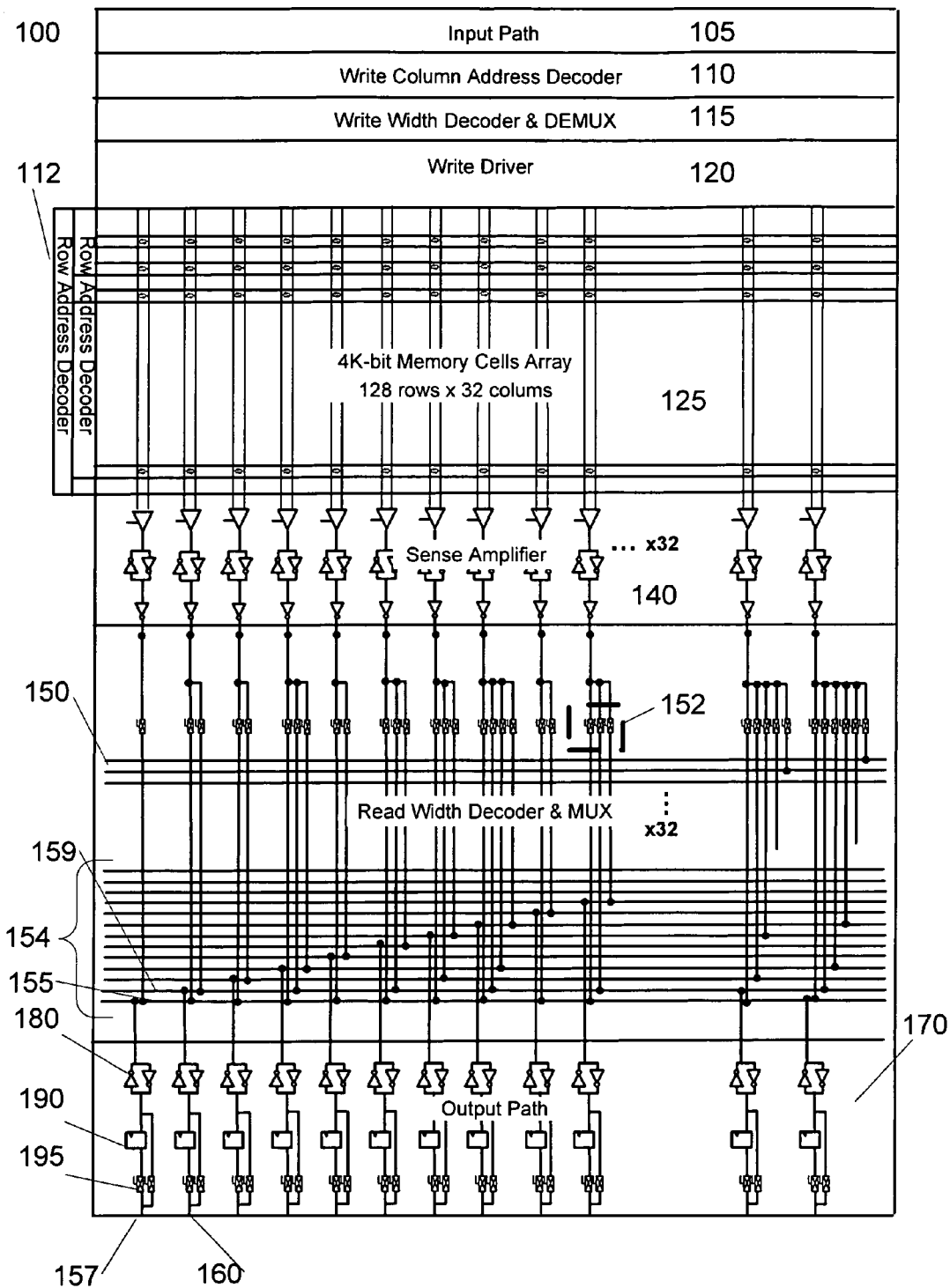
FIG. 1 illustrates an example prior memory unit of a programmable device.

FIG. 1 illustrates an example prior memory unit 100 of a programmable device. In this example, memory unit 100 has a capacity of 4096 bits of storage, which can be addressed and accessed in widths of 1, 2, 4, 8, 16, and 32 bit at a time. Memory unit 100 includes input path 105. Input path 105 includes input registers for temporarily storing data from other portions of the programmable devices that is to be stored in the memory unit 100. Input path can also include address and control registers for receiving and storing memory addresses and memory unit control and configuration information. Input path 105 can also include control logic for operating the memory unit.

Write column address decoder 110 decodes the memory addresses associated with incoming data to determine the appropriate column of the memory cell array 125 to store the data. Similarly, row address decoders 112 decodes the memory addresses associated with incoming data to determine the appropriate row of the memory cell array 125 to store the data. Row address decoders 112 also decode memory addresses associated with memory read requests to determine the appropriate row of the memory cell array 125 to read data from. Write width decoder 115 further directs incoming data to a column of the memory cell array 125 based on the memory unit's 100 write data width. As discussed above, the memory unit can be written to and read from using data widths specified by the user design. Write driver 120 includes tri-state drivers and other write control logic to store incoming data in memory cells of the memory cell array 125.

Memory cell array 125 includes a plurality of memory cells arranged along columns of bit lines and rows of word lines. Memory cells can include any type of memory device known in the art, including static memory, such as SRAM; dynamic memory, such as DRAM; and non-volatile memory, such as flash memory. Additionally, memory cell array 125 can include a single port or two or more ports to enable simultaneous read and write operations.

In this example, memory cell array 125 includes 4096 bits of storage arranged in 32 columns and 128 rows. Thus, the full data width of the memory unit 100 is 32 bits. The write width decoder 115 and read width decoder 150, discussed below, can redirect data from columns of the memory cell array to appropriate data outputs to enable the memory unit to be accessed using data widths of 1, 2, 4, 8, 16, or 32 bits. In alternate embodiments, the memory cell array and associated read and write width decoders can be configured for any arbitrary data widths, including data widths that are not powers of two. For example, the memory cell array 125 can be 36 bits wide to accommodate additional parity data. The read and write width decoders can consequently be adapted to handle these additional bits of data.

Memory cell array 125 is read by sense amplifier unit 140. Sense amplifier unit can further include output data latches for temporarily storing data read from the memory cell array 125. In this example, the sense amplifier unit 140 includes one sense amplifier for each column of the memory cell array 125.

Read width decoder 150 is configured to channel data from the columns of the memory cell array 125 to appropriate data outputs based on the data width specified for the memory unit 100. In this example, the read width decoder includes sets of one or more tri-state drivers or other switching devices. Each set of tri-state drivers, such as tri-state driver set 152, is connected with one sense amplifier of the sense amplifier unit 140, and thus one column of the memory cell array 125. Each set of tri-state drivers associated with a column of the memory cell array 125 with the set of bus lines 154. Each tri-state driver in a set of tri-state drivers is connected with one of the bus lines in the set of bus lines 154. Each bus line in the set of bus lines 154 is connected with one output in the output unit 170. Thus, by activating the appropriate tri-state driver in a set of tri-state drivers associated with a column of the memory cell array, data from that column can be channeled through one of the set of bus lines 154 to an output of the output unit 170.

Output unit 170 includes latches 180 to hold the data value read from the memory cell array 125 after the sense amplifier unit 140 has been deactivated. In this example, output unit 170 also includes output data registers 190 that enable the memory unit 100 to provide registered data output. Additionally, output multiplexers 195 enable the output unit to provide unregistered or registered data output. In an embodiment, the unregistered or registered data output in the output unit 170 is provided to a data bus for communication with other portions of the device that includes the memory unit 100.

When the memory unit 100 is configured to output data using less than the full data width, different columns of the memory cell array are connected with the same outputs depending upon the read address provided to the memory unit 100. For example, if the memory unit 100 is configured with a 1-bit data width, then all of the columns of the memory cell array 125 may be connected via their respective sets of tri-state drivers to bus line 155, which in turn is connected with the output 157. The last five bits, for example, of the read address are used to select one column at a time to connect with output 157. Similarly, if the memory unit 100 is configured with a 2-bit data width, then the columns of the memory cell array 125 may be connected via their associated sets of tri-state drivers with either bus line 155 or 159, which in turn are connected with outputs 157 and 160, respectively. In this example, the last four bits of the read address may be used to select two columns at a time of the memory cell array 125 to connect with outputs 157 and 160 respectively.

In example memory unit 100, the read width decoder 150 is configured such that data from a column of the memory cell array 125 must pass through one of the set of bus lines 154 regardless of the data width used by the memory unit. When the memory unit 100 is configured for full width data output, which in this example is a 32-bit data width, each column of the memory cell array 125 is connected via the set of bus lines 154 with a different one of the outputs of the output unit 170. During full width data output, the read width decoder 150 is essentially redundant, as each column is always connected with a different output of the output unit 170, regardless of the read address. Because of the length and associated capacitance of the set of bus lines 154, the memory access speed is decreased by this example read width decoder 150. This is true even when the memory unit 100 is configured for full width data output, as data from the memory cell array 125 must still pass through the set of bus lines 154.

Figure 2:
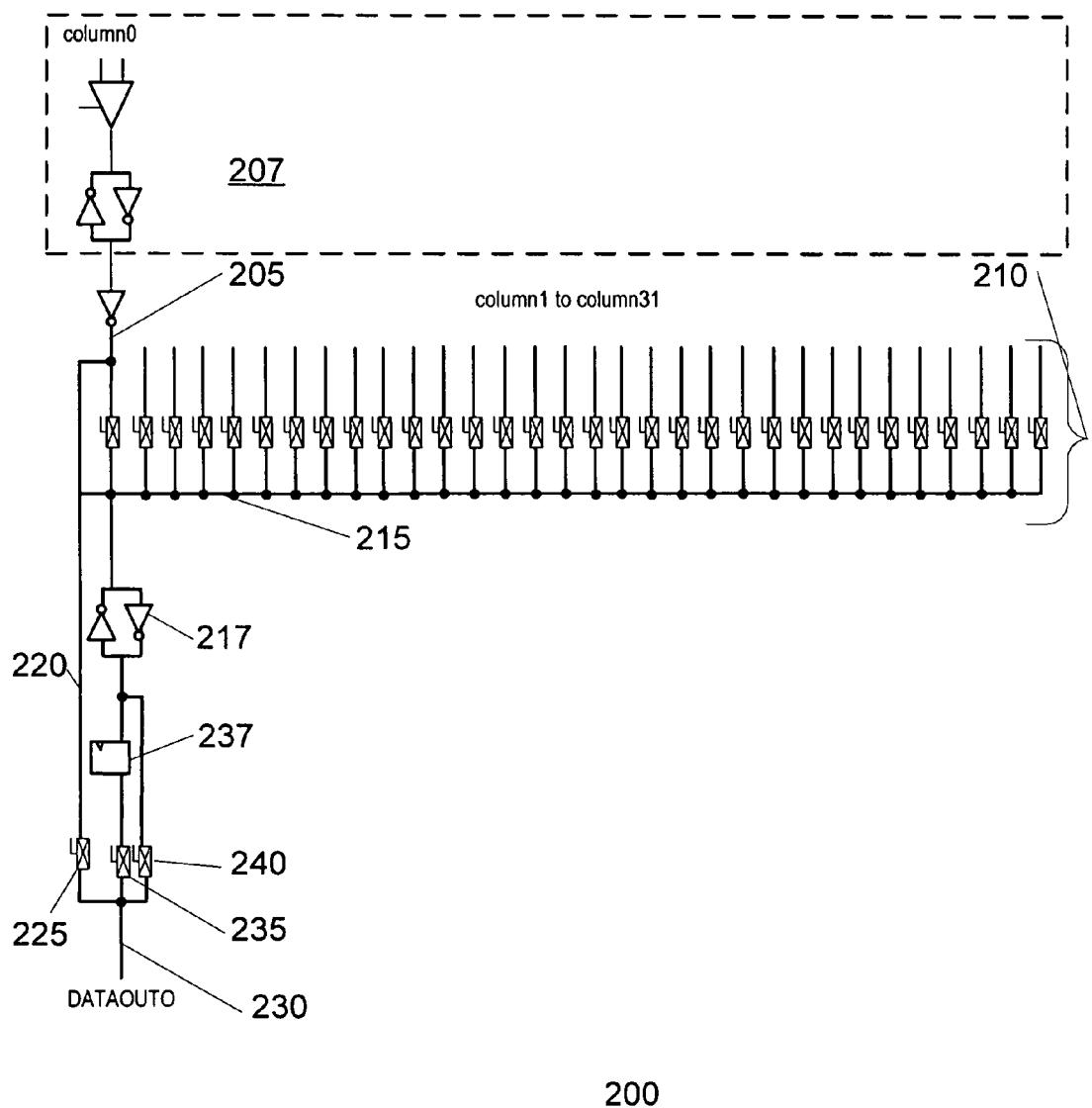
FIG. 2 illustrates a portion of width decoding logic of an example memory unit according to an embodiment of the invention.

FIG. 2 illustrates a portion 200 of width decoding logic of an example memory unit according to an embodiment of the invention. Portion 200 includes a connection with a column 205 of a memory cell array 207. The column 205 and one or more other columns of the memory cell array, omitted for clarity, are connected with a set of tri-state drivers 210. Portion 200 includes a bus line 215 and one or more sets of tri-state drivers 210, both of which are part of a read width decoder as described above. The set of tri-state drivers are controlled as discussed above so that any of the columns can be selectively connected with bus line 215. Bus line 215 is connected with output 217 of an output unit.

To improve memory access time during full data width operation, an embodiment of the width decoding logic includes a read bypass path 220. Read bypass path 220 is controlled by tri-state driver or other switching device 225. When tri-state driver 225 is activated, read bypass path 220 provides a direct connection between column 205 of the memory cell array and the output 230. The connection provided by read bypass path 220 does not pass through bus line 215; thus the read access time is decreased. In an embodiment, each column of the memory cell array 207 includes a read bypass path connecting the column with a different output of the output unit. The read bypass paths can then be used to provide decreased read access times when the memory unit is configured for full data width operation.

In an embodiment, a memory array including portion 200 includes three modes of operation: registered data output; unregistered data output; and unregistered full-width output. In registered data output mode, the tri-state driver 235 is activated and output 230 is connected with the data output register 237, providing registered data output. In this mode of operation, the read width decoder can be used to provide different output data widths depending upon the requirements of the application implemented by the programmable device.

In unregistered data output mode, the tri-state driver 240 is activated. Data bypasses data output register 237. In this mode, output 230 provides unregistered data output. Although the data output is unregistered in this mode, data still passes through the read width decoder. Thus, the memory unit can output data in different output data widths to meet the needs of applications implemented by the programmable device.

In an embodiment of unregistered full-width output mode, the memory unit is configured for full data width operation. In this mode, tri-state driver 225 is activated and output 230 is connected with column 205 of the memory cell array 207 via read bypass path 220. Similarly, other columns of the memory cell array are connected via their respective read bypass paths to other outputs of the memory cell array. The read width decoder and its associated bus lines are bypassed in this mode, which provides improved memory read access times.

Figure 3:
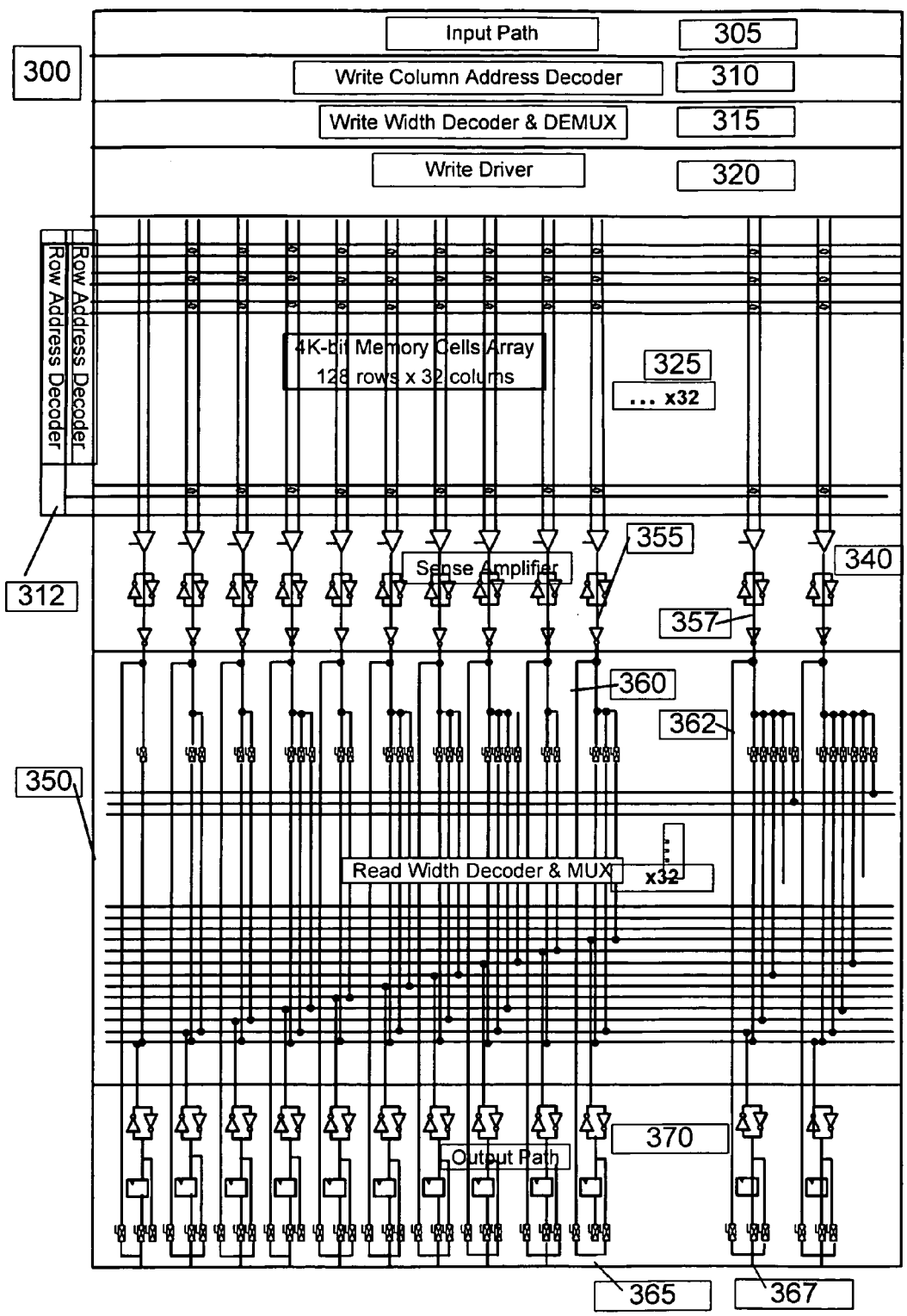
FIG. 3 illustrates an example memory unit of a programmable device according to an embodiment of the invention.

FIG. 3 illustrates an example memory unit 300 of a programmable device according to an embodiment of the invention. Memory unit 300 includes input unit 305; write column decoder 310; read and write row address decoder 312; write driver 320; memory cell array 325; sense amplifier unit 340; and output unit 370, which are similar to units 105, 110, 112, 115, 120, 125, 140, and 170 of memory 100, respectively.

An embodiment of memory unit 300 includes a read width decoder 350 with features similar to portion 200 discussed above. In this embodiment, each column of the memory cell array is connected with a read bypass path. Each read bypass path provides a direct connection between the output of a column of the memory cell array 325 and an output of the output unit 370. For example, the output of the sense amplifier associated with column 355 is connected with read bypass path 360. Read bypass path 360 connects the output of column 355 directly with output 365 of output unit 370. Similarly, the output of the sense amplifier associated with column 357 is connected with read bypass path 362. Read bypass path 362 is connected with output 367 of the output unit.

In an embodiment of memory unit 300, similar read bypass paths are associated with each column of the memory cell array 325. This embodiment of memory unit 300 provides improved memory read access times when operating in full data width mode. In a further embodiment, an application implemented by the programmable device can operate the memory unit 300 in full data width mode even if width decoding is required. In this embodiment, additional decoding logic outside of the memory unit 300, such as address decoding logic and registers, can be implemented using the programmable device to change the width of data received from the memory unit. Additionally, the programmable switching circuit of the programmable device, which is used to route connections between logic cells, memory units, and other portions of the programmable device, can be used to implement some or all of this additional decoding logic.

Figure 4:
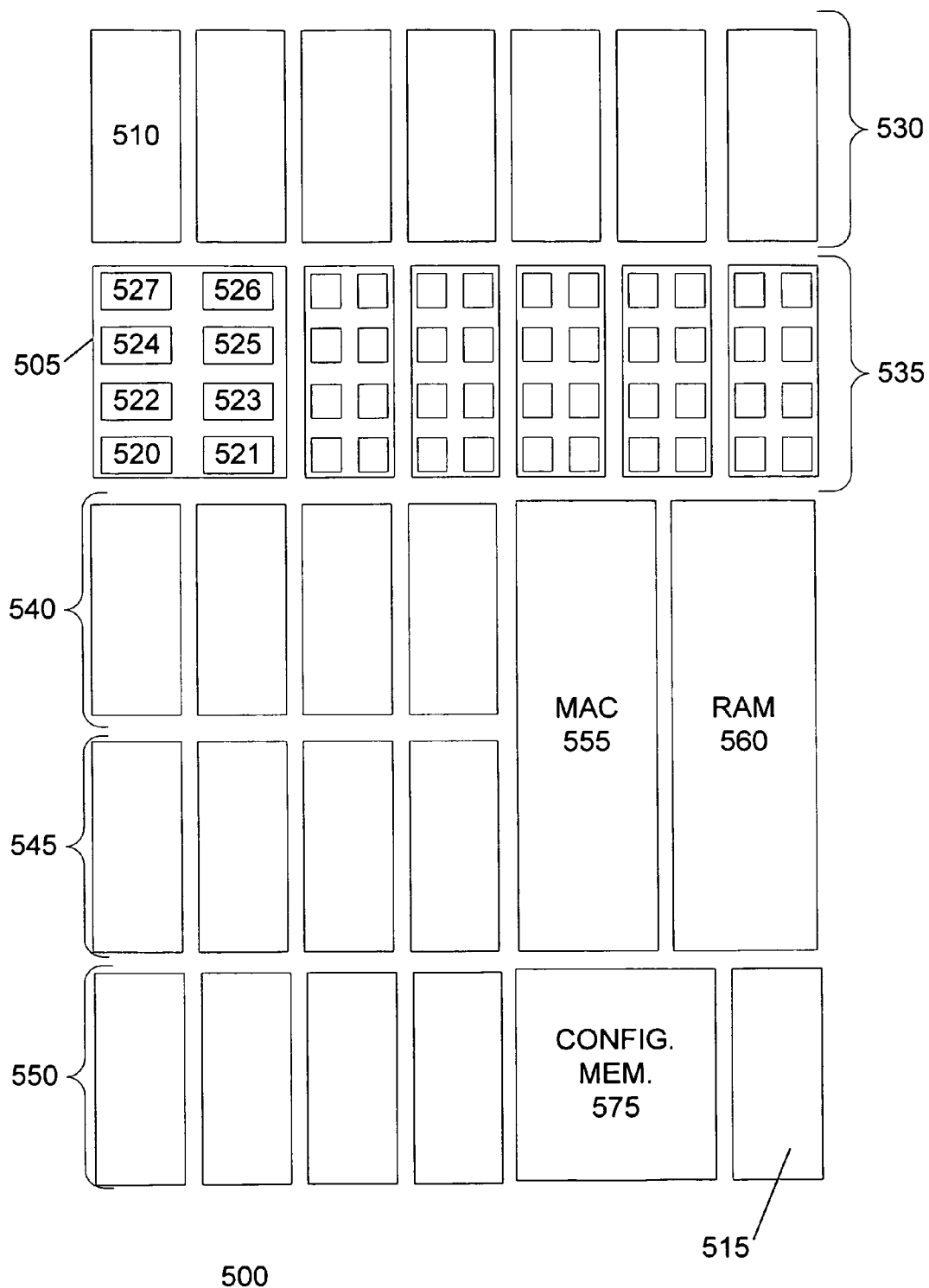
FIG. 4 illustrates a programmable device according to an embodiment of the invention.

FIG. 4 illustrates a programmable device according to an embodiment of the invention. Programmable device 500 includes a number of logic array blocks (LABs), such as LABs 505, 510, 515. Each LAB includes a number of programmable logic cells using logic gates and/or look-up tables to perform a logic operation. LAB 505 illustrates in detail logic cells 520, 521, 522, 523, 524, 525, 526, and 527. Logic cells are omitted from other LABs in FIG. 4 for clarity. The LABs of device 500 are arranged into rows 530, 535, 540, 545, and 550. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 500 also include specialized functional blocks, such as multiply and accumulate block (MAC) 555 and random access memory units (RAM) 560. The configuration of the programmable device is specified at least in part by configuration data stored in configuration memory 575. The configuration data can include parameters specifying the data widths of one or more memory units 560 as well as the configuration of the programmable switching circuit. Additional configuration data can be stored in other parts of the programmable device. For example, the configuration data can include look-up table data to be stored in look-up table hardware in a logic cell. The look-up table data specifies a function to be implemented by the look-up table hardware. For clarity, the portion of the programmable device 500 shown in FIG. 4 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A memory unit comprising:
a memory cell array adapted to store data, wherein the memory cell array is adapted to output the data at a first data width;
a memory width decoder unit adapted to receive the data at the first data width from the memory cell array and to output at least a portion of the data at a second data width;
an output unit adapted to receive the portion of the data at the second width from the memory width decoder and to provide the portion of the data at the second data width to a data bus; and
a set of read bypass paths connected between the memory cell array and the output unit and adapted to provide the data at the first data width to the data bus, wherein the data provided by the set of read bypass paths does not pass through at least a portion of the memory width decoder.

2. The memory unit of claim 1, wherein:
the memory cell array is adapted to store data in at least one row including a plurality of columns, wherein the first data width corresponds with the number of columns; and
the memory width decoder is adapted to receive at least a portion of a memory address and includes a multiplexer, the multiplexer adapted to receive data from a set of at least two columns of the memory cell array and to selectively connect one of the set of at least two columns of the memory cell array with one of a set of output connections of the output unit in response to the portion of the memory address.

3. The memory unit of claim 2, wherein the memory width decoder is further adapted to receive a memory configuration signal specifying the second data width and the multiplexer is further responsive to the memory configuration signal in selectively connecting one of the set of at least two columns of the memory cell array with one of the set of output connections of the output unit.

4. The memory unit of claim 2, wherein the data provided by the set of read bypass paths does not pass through the multiplexer.

5. The memory unit of claim 1, wherein the output unit includes at least one output register connected with the data bus, thereby providing a registered version of the portion of the data to the data bus.

6. The memory unit of claim 5, wherein the set of read bypass paths are connected with the data bus, thereby providing unregistered data from the memory cell array at the first data width.

7. The memory unit of claim 1, further comprising:
a set of switching devices adapted to selectively enable data from the memory cell array to pass through the set of read bypass paths while preventing data from the memory cell array from passing through at least the portion of the read bypass unit.

8. A programmable device comprising:
logic cells adapted to implement functions in response to configuration data;
a memory unit;
a configurable switching circuit adapted to provide connections with the logic cells and the memory unit in response to the configuration data; and
a configuration memory adapted to store configuration data;
wherein the memory unit comprises:
a memory cell array adapted to store data, wherein the memory cell array is adapted to output the data at a first data width;
a memory width decoder unit adapted to receive the data at the first data width from the memory cell array and to output at least a portion of the data at a second data width;
an output unit adapted to receive the portion of the data at the second width from the memory width decoder and to provide the portion of the data at the second data width to a data bus; and
a set of read bypass paths connected between the memory cell array and the output unit and adapted to provide the data at the first data width to the data bus, wherein the data provided by the set of read bypass paths does not pass through at least a portion of the memory width decoder.

9. The programmable device of claim 8, wherein the first data width is specified by a memory configuration signal provided by the configuration data stored in the configuration memory and received by the memory width decoder.

10. The programmable device of claim 9, wherein the memory cell array is adapted to store data in at least one row including a plurality of columns, wherein the first data width corresponds with the number of columns; and
the memory width decoder is adapted to receive at least a portion of a memory address and includes a multiplexer, wherein the multiplexer is adapted to receive data from a set of at least two columns of the memory cell array and to selectively connect one of the set of at least two columns of the memory cell array with one of a set of output connections of the output unit in response to the portion of the memory address and the memory configuration signal.

11. The programmable device of claim 10, wherein the data provided by the set of read bypass paths does not pass through the multiplexer.

12. The programmable device of claim 8, wherein the output unit includes a set of data registers and is adapted to include a registered data output mode providing a registered version of the portion of the data to the data bus at the second data width.

13. The programmable device of claim 8, wherein the output unit includes a set of unregistered data paths and is adapted to include an unregistered data output mode providing an unregistered version of the portion of the data to the data bus at the second data width.

14. The programmable device of claim 8, wherein the set of read bypass paths are connected with the data bus via a set of switching devices, thereby providing an unregistered version of the data from the memory cell array to the data bus at the first data width.

15. The programmable device of claim 8, wherein the data bus is adapted to convert the data provided by the read bypass path at the first data width to a third data width in response to the configuration data.

16. The memory unit of claim 1, wherein the set of read bypass paths provide a direct connection between the memory cell array and the output unit.

17. The memory unit of claim 1, wherein the first data width is the full data width of the memory cell array.

18. The memory unit of claim 2, wherein each read bypass path is connected to a respective output of the plurality of columns and with a respective connection of the output unit.

19. The memory unit of claim 8, wherein the set of read bypass paths provide a direct connection between the memory cell array and the output unit.

20. The memory unit of claim 8, wherein the first data width is the full data width of the memory cell array.

21. The memory unit of claim 10, wherein each read bypass path is connected to a respective output of the plurality of columns and with a respective connection of the output unit.

* * * * *